United States Patent [19]

Waugh

[11] Patent Number: 4,912,327

[45] Date of Patent: Mar. 27, 1990

[54] PULSED MICROFOCUSED ION BEAMS

[75] Inventor: Allen R. Waugh, East Grinstead, England

[73] Assignee: VG Instruments Group Limited, Crawley, England

[21] Appl. No.: 364,202

[22] Filed: Jun. 9, 1989

Related U.S. Application Data

[63] Continuation of Ser. No. 90,693, Aug. 28, 1987, abandoned.

[51] Int. Cl.[4] ........................ H01J 37/08; H01J 49/40

[52] U.S. Cl. .................................... 250/309; 250/307; 250/398; 250/397; 250/287

[58] Field of Search .................... 250/286, 396 R, 398, 250/397, 309, 307, 287

[56] References Cited

U.S. PATENT DOCUMENTS

| | | | |
|---|---|---|---|
| 3,096,437 | 7/1963 | Muray | 250/286 |
| 3,164,718 | 1/1965 | King | 250/290 |
| 3,600,573 | 8/1971 | Watan | 250/286 |
| 3,634,683 | 1/1972 | Bakker . | |
| 3,970,854 | 7/1976 | Boroffka | 250/281 |
| 4,107,527 | 8/1978 | Cherepin et al. | 250/309 |
| 4,434,371 | 2/1984 | Knauer | 250/396 R |
| 4,439,685 | 3/1984 | Plies | 250/390 |
| 4,442,354 | 4/1984 | Hurst et al. | 250/309 |
| 4,503,329 | 3/1985 | Yamaguchi et al. | 250/309 |
| 4,626,690 | 12/1986 | Todokoro et al. | 250/398 |
| 4,634,871 | 1/1987 | Knauer | 250/358 |
| 4,684,809 | 8/1987 | Nakasuji | 250/398 |

FOREIGN PATENT DOCUMENTS 3144604 5/1983 Fed. Rep. of Germany .

OTHER PUBLICATIONS

Elektronik Fürz Eim Ion ensouden mass enspektrometer, Rudenauer et al., *Nucl. Inst. & Methods*, vol. 128, No. 2, pp. 309–313, (1975).

A. R. Waugh et al., "Development of an Imaging Time-of-Flight Sims Instrument", 1986—Microbeam Analysis, pp. 82–84.

A. R. Bayly et al., "The Application of Liquid Metal Ion Source to Ion-Microprobe Secondary Ion Mass Spectroscopy", 1984—Spechtrochimica Acta, vol. 40B, pp. 717–723.

L. Valgi Wiley, "Methods for the Production of Nanosecond Ion Current Pulses", 1980—Atom & Ion Sources, pp. 258 ∝ 280.

*Primary Examiner*—Bruce C. Anderson

*Attorney, Agent, or Firm*—Chilton, Alix & Van Kirk

[57] ABSTRACT

An ion gun for producing a pulsed microfocused beam of ions comprises an ion source arranged to produce a continuous ion beam along a z-axis toward a collector having an aperture on the axis. A deflector is arranged to maintain the beam substantially stationary and incident on the aperture for a pulse time, to deflect the beam away from the aperture to the collector and subsequently to return the beam to be incident at the aperture. A focussing lens focusses the beam from the deflection point to a final image point, and a condensing lens focusses the beam at the deflection point. A mass filter selects a single ion species, and a second deflector deflects the beam orthogonally to the deflector so that the returning path of the beam on the collector does not cross the aperture. A stigmator and a beam scanner are also provided.

16 Claims, 7 Drawing Sheets

PULSED MICROFOCUSED ION BEAMS

This is a continuation of co-pending application Ser. No. 090,693 filed on 8/28/87, now abandoned.

This invention relates to a method and apparatus for providing a pulsed, microfocused beam of ions, particularly but not exclusively for the purpose of providing a pulsed, microfocused primary ion beam for the analysis of materials by time-of-flight, secondary particle mass spectrometry.

In time-of-flight secondary particle mass spectrometry a pulsed primary ion beam is directed towards the surface of a sample, thereby releasing material of the surface, which is then extracted in the form of a pulsed beam of secondary particles. For each pulse, the times-of-flight of the secondary particles are measured over a fixed distance, and hence the masses of the secondary particles can be deduced, and the particles identified. Secondary ions or secondary neutral particles may be analysed, hence one version of this technique is time-of-flight secondary ion mass spectrometry (TOFSIMS), and another is time-of-flight secondary neutral mass spectrometry (TOFSNMS). Furthermore an image of the distribution of species on a surface of a sample can be generated by scanning a primary beam in two dimensions across the surface, and synchronously detecting the secondary particles. Apparatus for an imaging TOFSIMS instrument has been described by A R Waugh et al in Microbeam Analysis, San Francisco Press Inc 1986, pages 82 to 84.

In TOFSIMS the primary ion beam may comprise ions of the inert gases such as argon $Ar^+$ or helium $He^+$, or alternatively liquid metals such as cesium $Cs^+$ or gallium $Ga^+$. Liquid metal ion sources have certain advantageous features, notably high brightness and small source size; their use for providing non-pulsed beams for secondary ion mass spectrometry (of the type in which analysis of secondary ions is by a technique other than time-of-flight analysis) has been described by A R Bayly et al in Spectrochimica Acta 40B, 1985, pages 717 to 723.

Known methods of generating pulsed ion beams, such as may be used to generate a pulsed primary ion beam for TOFSIMS or TOFSNMS, are described by L Valyi in Atom and Ion Sources, Wiley 1980, pages 258 to 420. One class of methods comprises the sweeping of a continuous beam across an aperture, producing a train of pulses, or bunches, of ions transmitted through the aperture. In such methods the size, duration and frequency of the pulses are dependent upon the size of the aperture, the velocity of the ions and the rate at which the continuous beam is swept across the aperture. The continuous beam may conveniently be swept by applying a sinusoidal alternating voltage to a pair of deflector plates; details of this technique are described by L Valyi (op cit) and also by U.S. Pat. No. 3164718. However, one disadvantage of a sinusoidal deflecting voltage is that the pulse duration, which depends upon the rate of sweep across the aperture, is dependent upon the frequency of the sinusoidal voltage, hence very short duration pulses are necessarily produced at high repetition rates. This problem is addressed by U.S. Pat. No. 3096437 which describes an apparatus in which the deflection voltage has an approximately trapezoidal waveform comprising voltage pulses having a fast, linear rise time and an exponential decay edge. In that apparatus the continuous beam is swept across an aperture during the linear rise time, hence the sweep rate is independent of the voltage waveform frequency; also the beam is deflected to one side of the aperture during the slow decay of each voltage pulse to avoid re-crossing the aperture during that time.

In TOFSIMS it is particularly advantageous to have a microfocused, pulsed ion beam, typically of the order of 0.1 μm in diameter, in which the beam pulses are typically of a duration of about 10 ns and have a repetition rate of about 10 kHz to 20 kHz. Microfocusing is important because the diameter of the primary beam determines the smallest area of the surface which may be sampled, and hence the spatial resolution of the image of the surface.

In known methods and apparatus for producing a pulsed beam, by sweeping a continuous beam across an aperture, the diameter or width of the pulsed beam is determined by the size of the aperture, because ions are transmitted through the aperture at an approximately constant rate as the beam crosses the aperture. The resulting beam diameter is not suitable in applications where a microfocused beam is required.

It is therefore an object of this invention to provide an improved method for producing a pulsed, microfocused ion beam, and also an object of this invention to provide a method of time-of-flight secondary particle mass spectrometry having improved means for generating a pulsed, microfocused primary ion beam. It is a further object of this invention to provide an improved apparatus for producing a pulsed, microfocused ion beam, and it is a yet further object to provide a time-of-flight secondary particle mass spectrometer with improved means for generating a pulsed, microfocused primary ion beam.

Thus according to one aspect of the invention there is provided a method of producing a pulsed microfocused ion beam comprising: generating a substantially continuous ion beam travelling from a source along a z-axis toward an aperture lying on said z-axis; maintaining said continuous ion beam to be substantially stationary and incident at said aperture for a time, to be known as the pulse-time; directing said continuous ion beam away from said aperture to a collector; and subsequently returning said continuous ion beam to be incident at said aperture. Preferably the method also comprises focusing ions, from the point at which the continuous ion beam is deflected when moved toward and away from said aperture, to a final image point.

Preferably the steps of maintaining the ion beam at the aperture and directing the beam away from the aperture are performed by the combined effect of two electrical power sources coupled to a pair of ion beam deflection electrodes. It is possible to make a power source which can change the state of its output very much more rapidly in one direction than in the other; for example a power supply can be made with a very fast rise time but a slower fall time (and vice versa). It is a preferred feature of this invention for the path of the ion beam to be arranged to be deflected from the collector to the aperture when a first of said power sources changes the state of its output in the direction of its rapid change, to be maintained at the aperture by maintaining substantially constant the outputs of the power sources, and to be deflected from the aperture to the collector by changing the state of the output of the second power source in the direction of its rapid change. Preferably a further pair of deflection electrodes are provided and arranged to deflect the beam in a different, e.g. orthogonal, direction. The beam may then be deflected in said different direction while said power sources change state in the opposite direction, so that the beam does not cross the aperture during the slower change of state of the output of the power sources.

Preferably the power sources are arranged to produce two-level pulses and are connected between ground and the respective deflection electrodes such that their outputs are of opposite level when the beam is directed to the collector and the same level when the beam is directed to the aperture. Said same level may comprise a zero output so that the beam is undeflected and is maintained at the aperture when there is no output from the power sources. In a preferred arrangement the first power source is arranged to rapidly change its output to the same level as the second to direct the ion beam to the aperture and then the second power source is arranged to rapidly change its output to the opposite level to direct the beam away from the aperture.

In preferred embodiments the continuous ion beam is deflected by the synchronised actions of a plurality of periodically-varying electric fields having components orthogonal to said z-axis. It is convenient, therefore, to describe said method with respect to a right-handed co-ordinate system of x, y and z-axes.

Preferably said method comprises: deflecting said continuous ion beam by the synchronised actions of a first electric field component Ey, directed along or parallel to a y-axis, and a second electric field component Ex, directed along or parallel to an x-axis, wherein said x, y and z axes are mutually orthogonal; and (a) for a time $\Delta t_1$, maintaining Ey at a value $Ey^o$, preferably substantially equal to zero, and during time $\Delta t_1$:
starting with said second electric field component Ex at a value $Ex^-$, directed along the negative direction of said x-axis, thereby deflecting said continuous ion beam away from said z-axis and said aperture, towards a first region on a collector; then
switching Ex from $Ex^-$ to a value $Ex^o$, substantially equal to zero, whereby said continuous ion beam travels substantially along said z-axis towards and through said aperture; next
maintaining Ex at $Ex^o$ for the pulse-time; and then
switching Ex from $Ex^o$ to a value $Ex^+$, directed along the positive direction of said x-axis, thereby deflecting said continuous ion beam away from said z-axis and said aperture towards a second region on said collector;

(b) at the end of time $\Delta t_1$ changing Ey from $Ey^o$ to another value, directed along said y-axis, thereby deflecting said continuous ion beam to a third region on said collector;

(c) during a time interval $\Delta t_2$, changing Ex from $Ex^+$ to said value $Ex^-$, and changing Ey from said other value to said value $Ey^o$, thereby returning said continuous ion beam to be incident at said first region on said collector, without allowing said continuous ion beam to be incident at said aperture, and thereby preventing any ions in said continuous ion beam from passing through said aperture, during said time interval $\Delta t_2$.

In step (b) above said method may comprise changing Ey from $Ey^o$ to a value $Ey^-$ directed along the negative direction of said y-axis, or to a value $Ey^+$ directed along the positive direction of said y-axis.

The first electric field component Ey may be generated by applying a periodically-varying voltage waveform $V_{ya}$ to a first y-deflecting electrode, and a periodically-varying voltage waveform $V_{yb}$ to a second y-deflecting electrode; and said second electric field component Ex may be generated by applying a periodically-varying voltage waveform $V_{xa}$ to a first x-deflecting electrode and a periodically-varying voltage waveform $V_{xb}$ to a second x-deflecting electrode; said continuous ion beam passing between said first and second y-deflecting electrodes, and between said first and second x-deflecting electrodes in travelling from said source to said aperture.

Preferably in one cycle of operation said method comprises:

(i) for a time $\Delta t_1$:
maintaining $V_{ya}$ at a substantially constant value $V_{ya,o}$ and maintaining $V_{yb}$ at a value $V_{yb,o}$ substantially equal to $V_{ya,o}$;
controlling $V_{xa}$ at a value $V_{xa,o}$, and $V_{xb}$ at a value $V_{xb,1}$, of which $V_{xb,1}$ is numerically greater than $V_{xa,o}$, thereby deflecting said continuous ion beam away from said z-axis and said aperture and towards a first region on said collector;
switching $V_{xb}$ from $V_{xb,1}$ to a value $V_{xb,o}$ which is substantially equal to $V_{xa,o}$ whereby said continuous ion beam travels substantially along said z-axis and through said aperture;
maintaining $V_{xa}$ at $V_{xa,o}$ and $V_{xb}$ at $V_{xb,o}$ for the pulse time;
switching $V_{xa}$ from $V_{xa,o}$ to a value $V_{xa,1}$ which is numerically greater than $V_{xb,o}$, thereby deflecting said continuous ion beam away from said z-axis and said aperture, and towards a second region on said collector;

(ii) at the end of time $\Delta t_1$, changing $V_{yb}$ from $V_{yb,o}$ to a value $V_{yb,1}$ thereby deflecting said continuous ion beam towards a third region on said collector;

(iii) during a time interval $\Delta t_2$ changing $V_{xa}$ from $V_{xa,1}$ to $V_{xa,o}$, and changing $V_{xb}$ from $V_{xb,o}$ to $V_{xb,1}$ and changing $V_{yb}$ from $V_{yb,1}$ to $V_{yb,o}$, thereby returning said continuous ion beam to be incident at said first region on said collector, without allowing said continuous ion beam to be incident at said aperture.

Preferably said method, in one cycle, comprises steps (i) and (ii) above and then during said time interval $\Delta t_2$ changing $V_{xa}$ from $V_{xa,1}$ to $V_{xa,o}$, and $V_{xb}$ from $V_{xb,o}$ to $V_{xb,1}$ thereby deflecting said continuous ion beam towards a fourth region on said collector, and subsequently changing $V_{yb}$ from $V_{yb,1}$ to $V_{yb,o}$ at the end of time interval $\Delta t2$.

In a preferred embodiment, in step (i) above, said method comprises; rapidly switching $V_{xb}$, in approximately 3 ns to 10 ns, from $V_{xb,1}$ to $V_{xb,o}$ in a substantially linear fashion; and subsequently, after the pulse-time, rapidly switching $V_{xa}$, in approximately 3 ns to 10 ns, from $V_{xa,o}$ to $V_{xa,1}$ in a substantially linear fashion. Also in a preferred embodiment, in step (iii) above said method comprises changing $V_{xa}$ from $V_{xa,1}$ to $V_{xa,o}$ exponentially, and changing $V_{xb}$ from $V_{xb,o}$ to $V_{xb,1}$ exponentially.

In the above, where the first and second x-deflecting electrodes are at voltages $V_{xa,o}$ and $V_{xb,o}$ respectively during the pulse-time it is preferable that $V_{xa,o}$ and $V_{xb,o}$ are each substantially equal to earth (zero) potential. $V_{xa,1}$ and $V_{xb,1}$ must be of sufficient magnitude to deflect the continuous ion beam away from the aperture: typically for a 30 keV beam of positive ions $V_{xa,1}$ and $V_{xb,1}$ are each equal to a voltage in the range from +300 V to +500 V; preferably +300 V. The invention is not restricted to these voltages however, for in order to achieve a substantially zero electric field $Ex^o$ between the x-deflecting electrodes it is only necessary for them to be at substantially equal potentials, and not necessarily earthed. However, we have found that the invention is most effective when the x-deflecting plates are both substantially at earth potential during the pulse-time; this is probably because with non-zero, albeit balancing voltages, fringe-fields are set up, between the x-deflecting electrodes and other components of the apparatus, which distort the path of the ions.

In an alternative embodiment there is provided a method having an alternative sequence of switching of voltage waveforms $V_{xa}$ and $V_{xb}$ from that described above, thus (ia) for a time $\Delta t_1$,
 maintaining $V_{ya}$ at $V_{ya,o}$, and $V_{yb}$ at $V_{yb,o}$;
 controlling $V_{xa}$ at $V_{xa,o}$, and $V_{xb}$ at $V_{xb,1}$;
 switching $V_{xa}$ from $V_{xa,o}$ to $V_{xa,1}$;
 maintaining $V_{xa}$ at $V_{xa,1}$ and $V_{xb}$ at $V_{xb,1}$ for said pulse-time;
 switching $V_{xb}$ from $V_{xb,1}$ to $V_{xb,o}$;
(iia) at the end of time $\Delta t_1$ changing $V_{yb}$ from $V_{yb,o}$ to $V_{yb,1}$;
(iiia) during time interval $\Delta t_2$ changing $V_{xa}$ from $V_{xa,1}$ to $V_{xa,o}$ and changing $V_{xb}$ from $V_{xb,o}$ to $V_{xb,1}$, and changing $V_{yb}$ from $V_{yb,1}$ to $V_{yb,o}$.

In this last described embodiment the first and second deflecting electrodes are at voltages $V_{xa,1}$ and $V_{xb,1}$ respectively during the pulse-time, and it is preferable here that $V_{xa,1}$ and $V_{xb,1}$ are each substantially equal to earth (zero) potential, while $V_{xa,o}$ and $V_{xb,o}$ are negative voltages, typically −300 V.

In the foregoing $V_{ya,o}$ and $V_{yb,o}$ are each typically equal to earth (zero) potential, and at the end of time $\Delta t_1$, $V_{ya}$ remains at $V_{ya,o}$ and $V_{yb}$ is switched from $V_{yb,o}$ to $V_{yb,1}$ (typically +400 V) to deflect the ion beam. However it is more convenient, in a preferred embodiment, in step (ii) and step (iia) above, actually to change $V_{ya}$ from $V_{ya,o}$ to a value $V_{ya,-2}$ and to change $V_{yb}$ from $V_{yb,o}$ to a value $V_{yb,2}$; where $V_{ya,-2}$ and $V_{yb,2}$ are of opposite polarities, and preferably of equal magnitude, and create an electric field component $Ey^-$ essentially the same as when $V_{ya}=V_{ya,o}$ and $V_{yb}=V_{yb,1}$. For example typical values are: $V_{ya,-2}=-200$ V and $V_{yb,2}=+200$ V. Subsequently, during step (iii) and step (iiia) above, $V_{yb}$ is returned from $V_{yb,2}$ to $V_{yb,o}$ and $V_{ya}$ is returned from $V_{ya,-2}$ to $V_{ya,o}$.

In a further preferred embodiment the method comprises focusing, to a final image point at a target, ions which travel from a point which is referred to as the deflection point and is located on the z-axis between the x-deflecting electrodes. The deflection point is the point at which Ex acts upon the ions to deflect the continuous ion beam. Preferably the continuous ion beam is focused from the source to the deflection point, by means of a condensing lens. It is also preferable to select single isotopes of ions of a certain species, for example gallium $^{69}Ga^+$ or $^{71}Ga^+$ ions, by a suitable method of mass filtering.

According to another aspect of the invention there is provided a method of analysing a sample by time-of-flight secondary particle mass spectrometry comprising: generating a pulsed microfocused primary ion beam as defined above; focusing said primary ion beam on to said sample, thereby causing secondary particles to be released from said sample; and measuring the times-of-flight of said secondary particles over a flight path from said sample to a detector. In a preferred embodiment there is provided a method of time-of-flight secondary ion mass spectrometry (TOFSIMS) as defined above and in which the secondary particles are secondary ions. Alternatively there may be provided a method of time-of-flight secondary neutral mass spectrometry (TOFSNMS) comprising ionising neutral particles released from the sample. Preferably each of said methods also comprises extracting the secondary ions, or ionised neutral particles, from the sample by accelerating them by an extraction potential P. The method may also comprise scanning the pulsed microfocused primary ion beam across the sample, thereby releasing secondary particles from an area on the surface of the sample, and allowing a two-dimensional image of the composition of that surface to be generated.

The time-of-flight of a secondary particle is measured, in a cycle of operation, by recording the difference $\Delta t_m$ between the time at which a particle is detected and a reference time earlier in said cycle; the reference time is a constant difference from, or is equal to, the time at which Ex is switched from $Ex^-$ to $Ex^o$, which in one embodiment, as described above, is when $V_{xb}$ is switched from $V_{xb,1}$ to $V_{xb,o}$ and in an alternative embodiment is when $V_{xa}$ is switched from $V_{xa,o}$ to $V_{xa,1}$. In this way during each cycle there is recorded a spectrum of times-of-flight for the secondary particles.

The mass m of a secondary particle with time-of-flight t over a flight path of length 1 is substantially equal to $(2ePt^2)/\mathbf{1}^2$ where $e=1.6\times10^{-19}$ Coulombs. The time-of-flight t is a constant difference from the directly measured interval $\Delta t_m$ ($\Delta t_m$ being directly related to the time of origin of the primary pulse, not the time of origin of the secondary particle). A true mass spectrum may be obtained by correcting for this difference, by calculation, or preferably by calibration against samples of species of known mass.

According to another aspect the invention provides a pulsed microfocused ion gun comprising:

a source of a substantially continuous ion beam and a collector having an aperture, there being defined a z-axis passing from said source through said aperture;

first deflecting means comprising a first x-deflecting electrode and a second x-deflecting electrode disposed on an x-electrode axis which is orthogonal to said z-axis, and separated by a first gap, through which said z-axis passes;

means to generate, and to apply to said first x-deflecting electrode, a first voltage waveform $V_{xa}$ comprising a sequence of pulses, in each of which $V_{xa}$ rises in a substantially linear fashion from a voltage $V_{xa,o}$ to a voltage $V_{xa,1}$, remains substantially equal to $V_{xa,1}$ for a time interval $\Delta t_a$, and then falls in a substantially exponential fashion to $V_{xa,o}$;

means to generate, and to apply to said second x-deflecting electrode a second voltage waveform $V_{xb}$ comprising a sequence of pulses, in each of which $V_{xb}$ falls in a substantially linear fashion from a voltage $V_{xb,1}$ to a voltage $V_{xb,o}$ which is substantially equal to $V_{xa,o}$, remains substantially equal to $V_{xb,o}$ for a time interval $\Delta t_b$ and then rises in a substantially exponential fashion from $V_{xb,o}$ to $V_{xb,1}$;

means to synchronise said first voltage waveform $V_{xa}$ with said second voltage waveform $V_{xb}$, whereby at a time, known as the pulse-time, after $V_{xb}$ falls from $V_{xb,1}$ to $V_{xb,o}$, it is arranged that $V_{xa}$ rises from $V_{xa,o}$ to $V_{xa,1}$, and during said pulse-time ions travel substantially undeflected, substantially along said z-axis to and through said aperture;

second deflecting means adapted to deflect said continuous ion beam away from said z-axis in a direction orthogonal to said z-axis and at an angle to said x-electrode axis; and means to apply a voltage to said second deflecting means to deflect said continuous ion beam away from said aperture while $V_{xa}$ is falling from $V_{xa1}$ to $V_{xa,o}$ and while $V_{xb}$ is rising from $V_{xb,o}$ to $V_{xb,1}$.

Alternatively there is provided means to synchronise $V_{xa}$ with $V_{xb}$ whereby at a time equal to said pulse-time, after $V_{xa}$ rises from $V_{xa,o}$ to $V_{xa,1}$ it is arranged that $V_{xb}$ falls from $V_{xb,1}$ to $V_{xb,o}$.

Preferably the ion gun also comprises a final focusing lens adapted to focus ions to an image from the deflection point, which lies on the z-axis between the x-deflecting electrodes as defined earlier. The ion gun may also comprise a condensing lens, disposed between the source and first deflecting means and capable of focusing the continuous ion beam to said deflection point. The condensing lens and the final focusing lens may each comprise any simple type of electrostatic lens, typically a conventional three element cylindrical lens. The final focusing lens, for example, may have outer elements at voltages $V_{L1}$ and $V_{L3}$, which may conveniently be earth potential, and a central element at a potential $V_{L2}$ in the range from 0.5 V to 1.2 $V_s$, typically 0.85 $V_s$, where $V_s$ is the source potential. The ion gun may also comprise stigmators preferably disposed between the collector (in which the aperture is formed) and the final focusing lens; such stigmators comprising a plurality of electrodes disposed around the z-axis, and to which potentials may be applied to correct astigmatism in the primary ion beam.

In a preferred embodiment the second deflecting means is adapted to deflect the continuous ion beam away from the z-axis in a direction substantially orthogonal to both the z-axis the x-axis. Preferably the second deflecting means comprises a first y-deflecting electrode and a second y-deflecting electrode disposed on a y-electrode axis, separated by a second gap through which the z-axis passes, the y-electrode axis being substantially orthogonal to the z-axis and preferably also substantially orthogonal to the x-electrode axis. Preferably the second deflecting means is disposed between the condensing lens and the x-deflecting means. The apparatus may also comprise, preferably disposed between the condensing lens and the y-deflecting means, a mass filter adapted to filter from said continuous ion beam all ions but those of a selected species. The mass filter may conveniently comprise a Wien filter having crossed electric and magnetic fields. In an especially preferred embodiment the source of said continuous ion beam comprises a liquid metal ion source, emitting gallium or cesium ions for example.

An advantage of this invention is that by maintaining the continuous beam to be travelling along the z-axis for the pulse time, it provides a substantially static point source suitable for microfocusing, whereas in prior apparatus a beam was swept across an aperture giving an inherently extended source of a pulsed beam. Moreover by providing a final focusing lens which has said deflection point as its object point, the invention ensures that only ions from that point are focused to the final image point, hence ions which pass between the x-electrodes at a radial distance from the z-axis greater than the radius of the object of the final lens do not significantly contribute to broadening of the final image. It is especially advantageous to limit the length of the x-deflecting electrodes parallel to the z-axis, thereby limiting the extent of field Ex parallel to the z-axis and limiting the size of the region near to the deflection point over which Ex acts to deflect the beam. It is found that the invention is particularly effective when the x-deflecting electrodes are approximately 1 mm long in the direction parallel to the z-axis.

Further, by altering the relative phase of the voltages applied to the deflecting electrodes the temporal width of the ion pulses may be easily controlled. According to another aspect the invention provides a time-of-flight secondary particle mass spectrometer, adapted for the analysis of a sample and comprising: an ion gun, as defined above, for producing a pulsed, microfocused primary ion beam at a final primary ion image point on a surface of said sample; and a particle detector for detecting secondary particles released from said surface by the action of said pulsed, microfocused primary ion beam.

In a preferred embodiment the spectrometer also comprises an energy-focusing particle analyser, disposed between the sample and the detector, and preferably capable of focusing secondary particles of equal mass but differing energies from the primary ion image point on said surface to a common secondary particle image point at the detector. Preferably also there is provided means to ionise neutral particles emitted from the sample; the spectrometer may conveniently comprise a source of laser radiation to ionise secondary neutral particles. The spectrometer may also comprise an extraction electrode, disposed between the sample and the analyser, and also means to apply a potential difference between the sample and the extraction electrode in order to acclerate secondary ions (or ionised secondary neutral particles) away from the sample and towards the analyser.

Preferably the ion gun comprises scanning electrodes disposed between the final focusing lens and the sample (which is the target of the ion beam); the scanning electrodes may be in the form of plates or alternatively quadrupole rods.

The spectrometer also comprises time-recording means to record, within substantially each cycle of operation and for substantially each detected secondary particle, the time interval between a reference time and the time at which said secondary particle is detected; said reference time is preferably the start of the pulse-time, as may conveniently be arranged by comparing the detection time with the time of a step in voltage waveform $V_{xa}$ or $V_{xb}$. For example in one embodiment of the invention there is generated a start signal when $V_{xb}$ falls from $V_{xb,1}$ to $V_{xb,o}$ (the start of the primary ion pulse time) and a plurality of stop signals corresponding to the arrival of a plurality of secondary particles at the detector. The start and stop signals are fed to the time-recording means which determines the corresponding time intervals. A mass spectrum can be obtained from the times-of-flight, as already described in this specification.

A preferred embodiment of the invention will now be described in greater detail by way of example and with reference to the figures in which.

Figure 8:
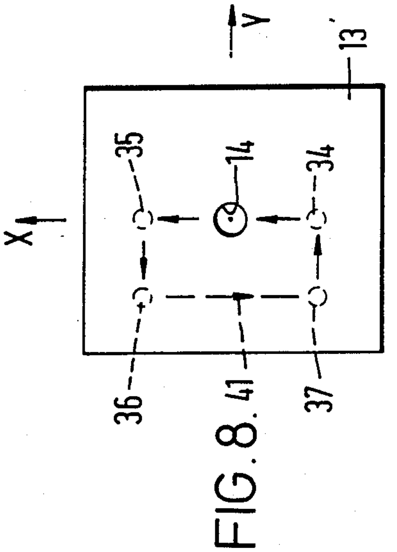
Figure 9:
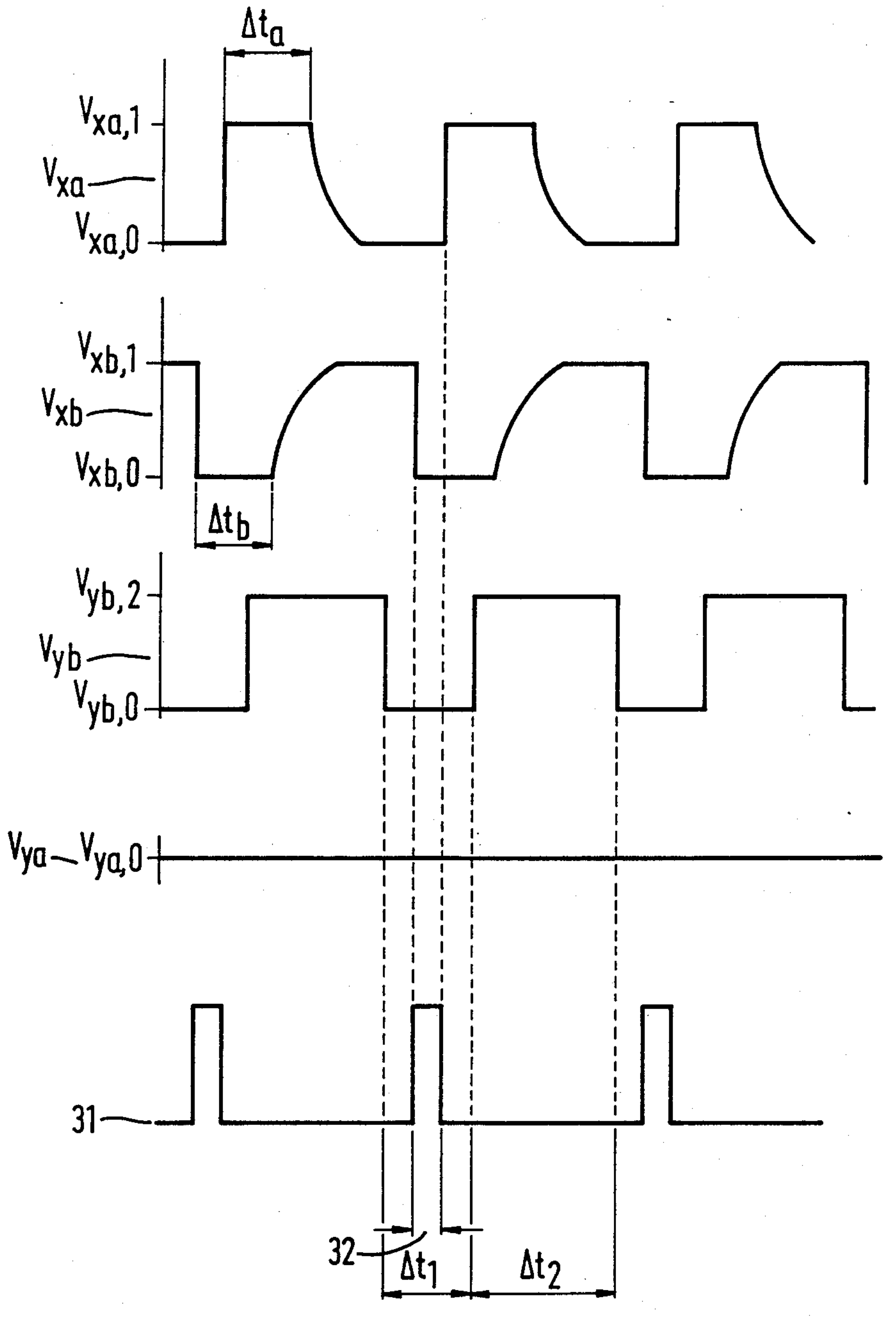
Figure 10:
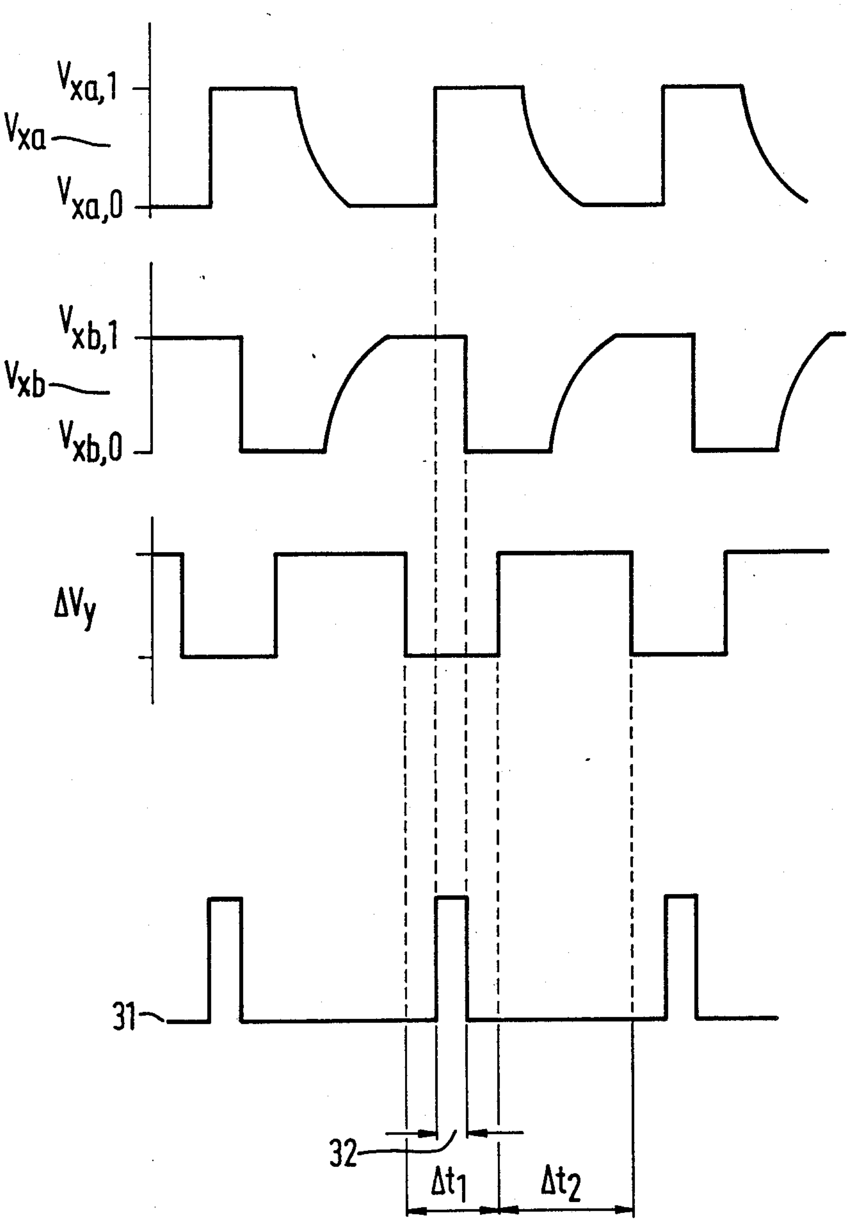

FIGS. 5, 6 and 7 and 8 further illustrate certain stages in the operation of the apparatus; and FIGS. 9 and 10 illustrate alternative sequences of switching the voltage waveforms.

Figure 1:
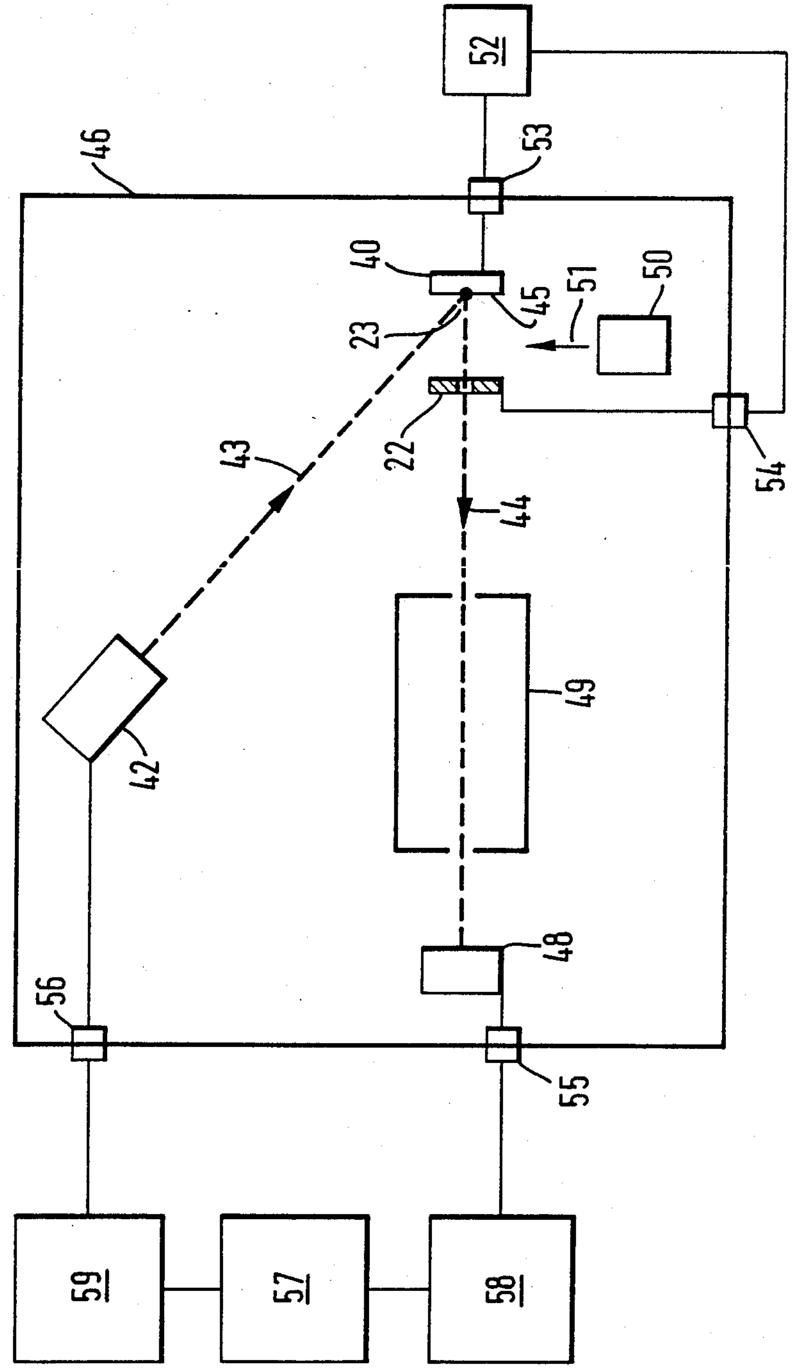
FIG. 1 illustrates an apparatus for time-of-flight secondary particle mass spectrometry.

Referring first to FIG. 1, a primary ion gun 42, a sample 40, an energy-focusing particle analyser 49 and a particle detector 48 are enclosed within an evacuated enclosure 46. Ion gun 42 directs a pulsed, microfocused beam of primary ions 43 towards a final primary ion image point 23 on a surface 45 of sample 40. A pulsed beam of secondary particles 44 travels from point 23, through analyser 49, to detector 48. A source of laser radiation 50 provides laser radiation 51 to ionise secondary neutral particles emitted from sample 40, if required. An extraction electrode 22 is disposed between sample 40 and analyser 49 as shown, and a power supply 52 maintains a potential difference of about 5 kV between electrode 22 and sample 40 thereby accelerating secondary ions towards analyser 49. The distance between sample 40 and electrode 22 is about 5 mm, though FIG. 1, for convenience, is not drawn to scale. Items 53, 54,55 and 56 are conventional vacuum-compatible electrical feedthroughs. It will be appreciated that pumps are provided to maintain ultra high vacuum conditions, as known in the art.

A controller 59 determines the time, in each cycle of operation, at which a pulse of primary ion beam 43 is generated by ion gun 42; as will be described later with reference to FIG. 3, a field Ex is switched from $Ex^-$ to $Ex^o$ by switching a deflection potential $V_{xb}$ from $V_{xb,1}$ to $V_{xb,o}$. At that time a 'start' signal is sent to a computer 57. Subsequently, for each secondary particle detected at detector 48 in that cycle, an amplifier 58 sends a stop signal to computer 57, and the time-of-flight of each of the secondary particles can be calculated. Amplifier 58 comprises a discriminator, to remove unwanted noise, and preferably amplifier 58 and computer 57 constitute part of a data acquistion system, as known in the art.

Figure 2:
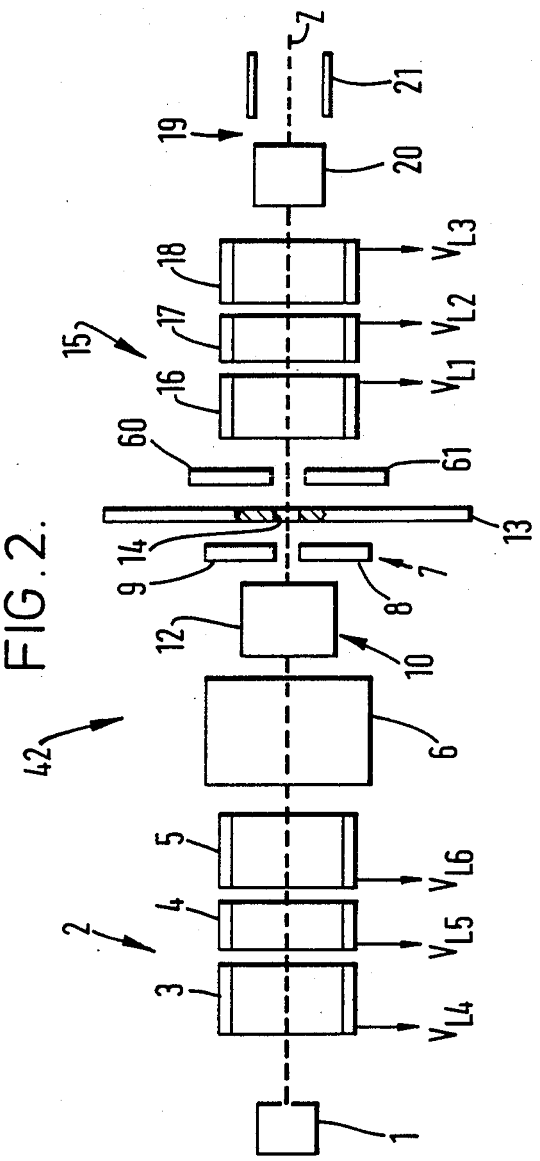
FIG. 2 illustrates detail of the ion gun of the apparatus of FIG. 1.

Referring next to FIG. 2, there is shown ion gun 42, which comprises: an ion source 1; a condensing lens 2 comprising elements 3, 4 and 5; a mass filter 6; a first deflecting means 7 comprising a first x-deflecting electrode 8 and a second x-deflecting electrode 9; a second deflecting means 10 comprising a first y-deflecting electrode 11 (hidden on this view but shown in FIG. 3) and a second y-deflecting electrode 12; a collector 13 having an aperture 14; stigmators 60 and 61 and a final focusing lens 15 comprising elements 16, 17 and 18; and a scanning means 19 comprising a first pair of scanning plates 20 (only one of which is shown in FIG. 2) and a second pair of scanning plates 21. Power supplies (not shown) control the voltages $V_{L1}$ to $V_{L6}$ of elements 3,4,5,16, 17 and 18.

Ion source 1 is typically a liquid metal ion source producing gallium $Ga^+$ ions to which is applied an accelerating voltage $V_s$ of 5 kV to 30 kV. Mass filter 6 typically comprises a Wien filter having means to generate crossed magnetic and electric fields, as will be understood. In FIG. 2 the apparatus is shown disposed on a z-axis.

Figure 3:
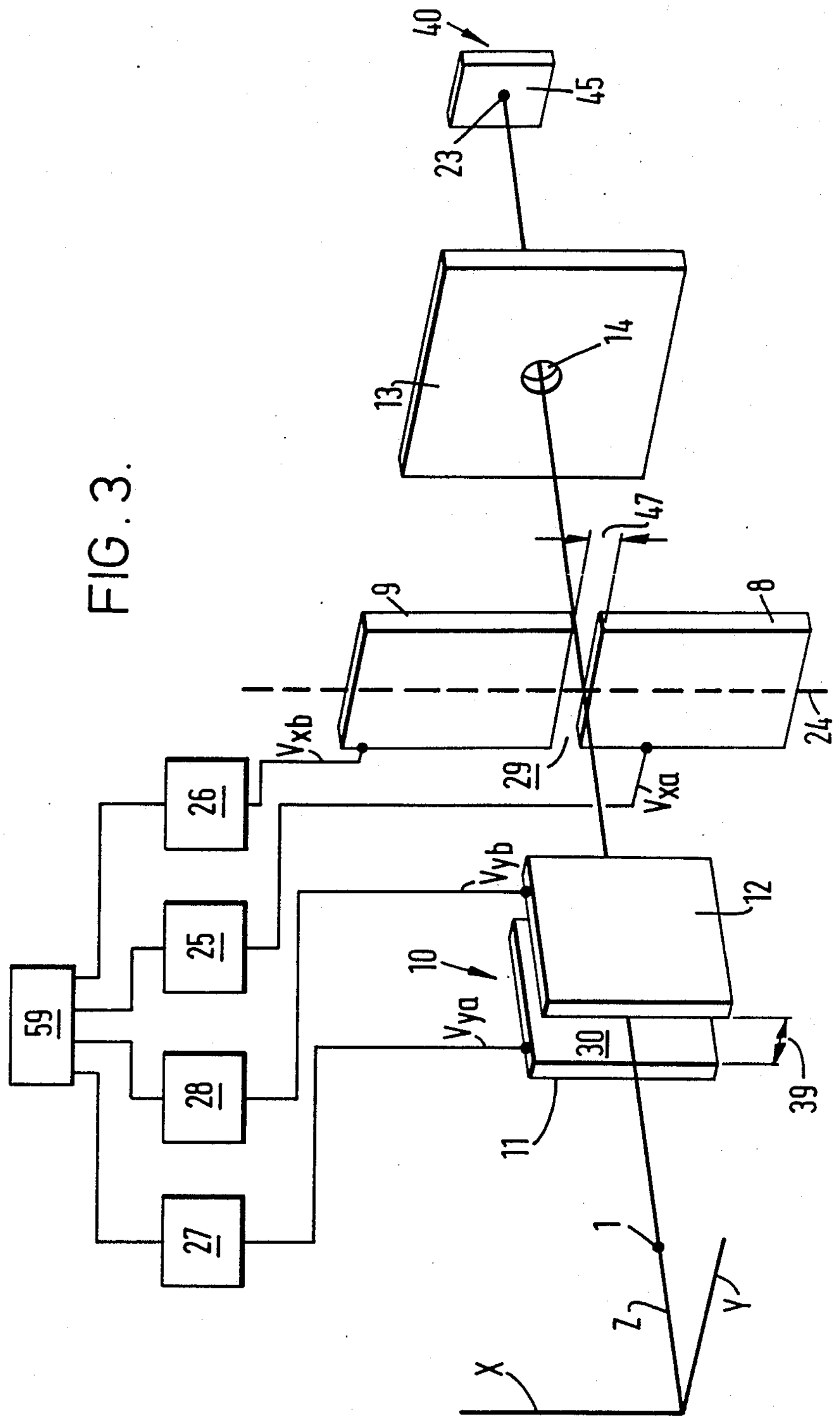
FIG. 3 illustrates certain components of the ion gun, to aid in the description of its operation.

Referring now to FIG. 3, certain components of the ion gun are again shown, here in a form to allow further explanation of their relative positions and functions. FIG. 3 shows an x-axis and a y-axis in addition to the z-axis shown in FIG. 2. Also shown in FIG. 3 are: first y-deflecting electrode 11; a target which is the surface 45 of sample 40; and final image point 23. Ion source 1 is represented by a point, for simplicity. First x-deflecting electrode 8 and second x-deflecting electrode 9 are disposed as shown on an x-deflecting axis 24, which is parallel to the x-axis. Electrode 8 is separated from electrode 9 by a first gap 47 which is typically equal to 0.2 mm in the x-direction. Electrodes 8 and 9 are typically 1 mm long in the z-direction. Aperture 14 is typically 0.1 mm to 0.2 mm in diameter. The y-deflecting electrodes 11 and 12 are separated by a second gap 39 as shown.

Voltage controllers 25, 26, 27 and 28 generate voltage waveforms $V_{xa}$, $V_{xb}$, $V_{ya}$ and $V_{yb}$ which are applied to electrodes 8, 9, 11 and 12 respectively. The outputs of controllers 25, 26, 27 and 28 are synchronised by a timing unit, represented symbolically by controller 59.

The voltages $V_{xa}$ and $V_{xb}$ determine the magnitude and direction of an electric field Ex in a region 29 between electrodes 8 and 9. Similarly voltages $V_{ya}$ and $V_{yb}$ determine the magnitude and direction of an electric field Ey in a region 30 between electrodes 11 and 12.

Figure 4:
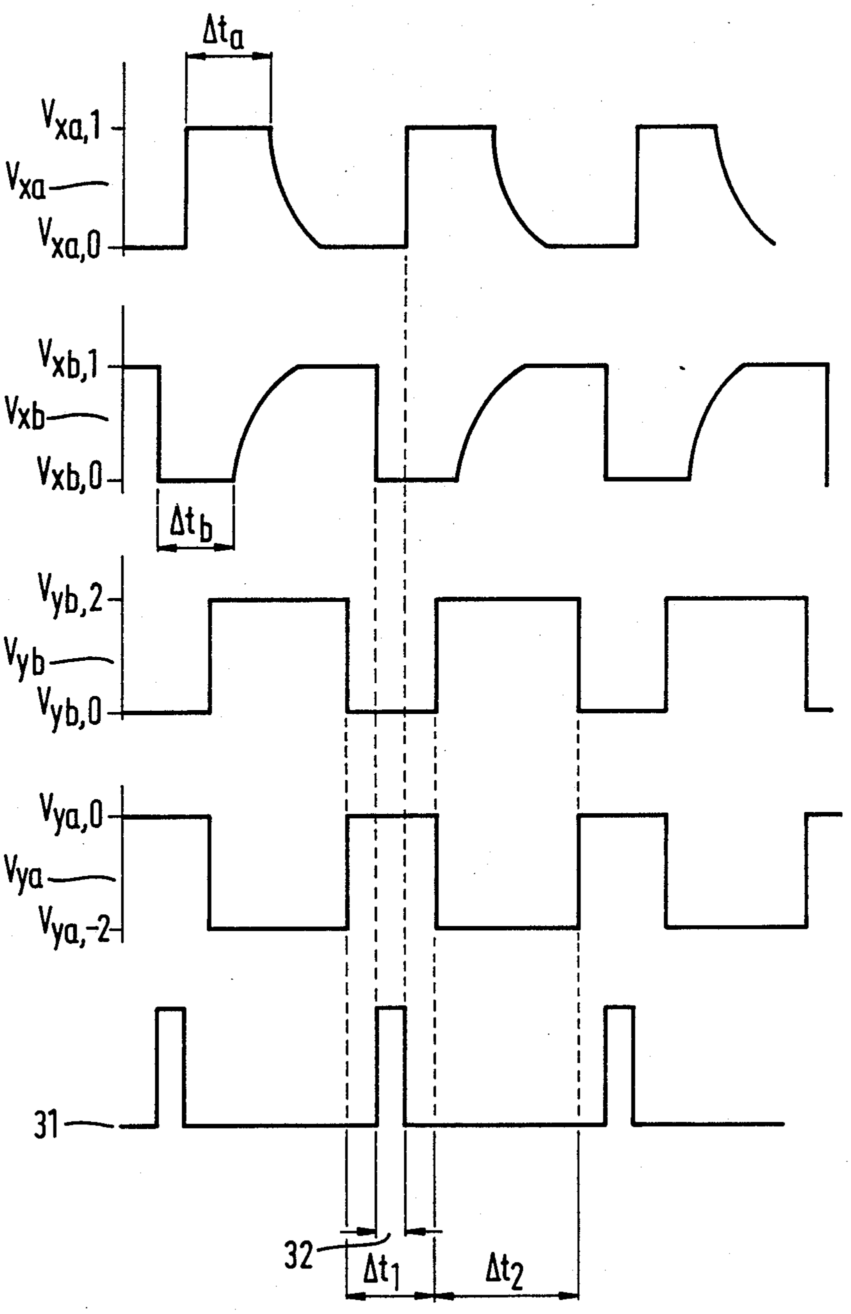
FIG. 4 illustrates the synchronised variation of voltages $V_{xa}$, $V_{xb}$, $V_{ya}$ and $V_{yb}$ in the preferred embodiment.

The method for operating the apparatus will now be described with reference to FIGS. 4 to 8. FIG. 4 illustrates waveforms $V_{xa}$, $V_{xb}$, $V_{ya}$ and $V_{yb}$. FIG. 4 also illustrates a time axis 31, as indicated. For the purposes of description, consider a cycle to start at the beginning of time interval $\Delta t_1$ (FIG. 4): at this time

| | | | | |
|---|---|---|---|---|
| $V_{xa}$ | = | $V_{xa,o}$ | typically | 0 V |
| $V_{xb}$ | = | $V_{xb,1}$ | typically | +300 V |
| $V_{ya}$ | = | $V_{ya,o}$ | typically | 0 V |
| $V_{yb}$ | = | $V_{yb,o}$ | typically | 0 V |

Figure 5:
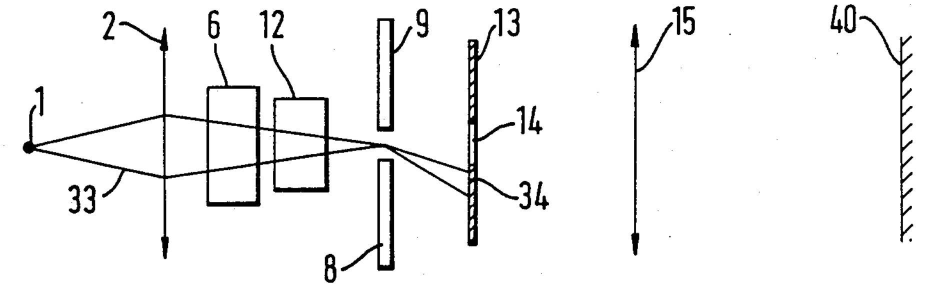

In this condition a continuous ion beam 33, emitted from source 1, is deflected by the electric field $Ex^-\cdot(\alpha V_{xa}-V_{xb})$ to a first region 34 on collector 13, as shown in FIG. 5. Next voltage controller 26 switches $V_{xb}$ from $V_{xb,1}$ to $V_{xb,o}$, so that:

| | | | | |
|---|---|---|---|---|
| $V_{xa}$ | = | $V_{xa,o}$ | typically | 0 V |
| $V_{xb}$ | = | $V_{xb,o}$ | typically | 0 V |
| $V_{ya}$ | = | $V_{ya,o}$ | typically | 0 V |
| $V_{yb}$ | = | $V_{yb,o}$ | typically | 0 V |

Figure 6:
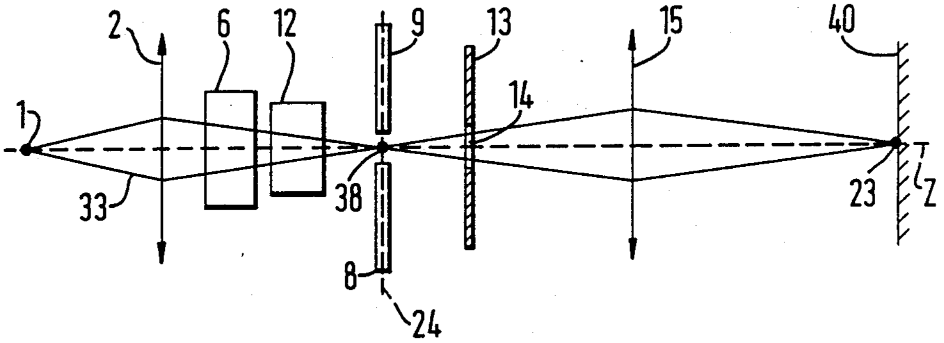

In this condition ions pass through aperture 14, as shown in FIG. 6. Lens 15 focuses ions from a deflection point 38 to a final primary ion image point 23 at sample 40. At the end of pulse-time 32 voltage controller 25 switches $V_{xa}$ from $V_{xa,o}$ to $V_{xa,1}$, so that:

| | | | | |
|---|---|---|---|---|
| $V_{xa}$ | = | $V_{xa,1}$ | typically | +300 V |
| $V_{xb}$ | = | $V_{xb,o}$ | typically | 0 V |
| $V_{ya}$ | = | $V_{ya,o}$ | typically | 0 V |
| $V_{yb}$ | = | $V_{yb,o}$ | typically | 0 V |

Figure 7:
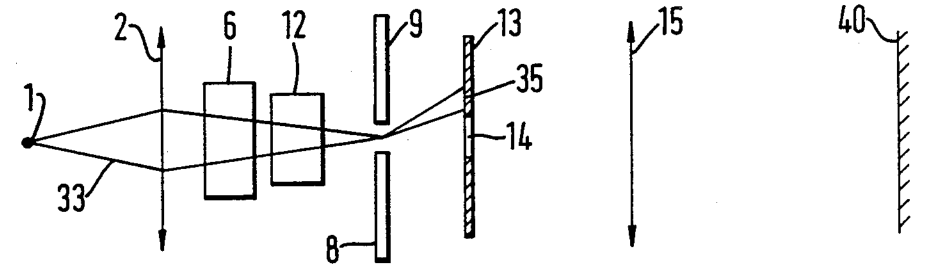

In this condition continuous ion beam 33 is deflected by electric field $Ex^+$ to a second region 35 on collector 13, as shown in FIG. 7. Next, at the end of interval $\Delta t_1$, and the start of interval $\Delta t_2$, voltage controller 27 switches $V_{ya}$ from $V_{ya,o}$ to $V_{ya,-2}$ and controller 28 switches $V_{yb}$ from $V_{yb,o}$ to $V_{yb,2}$, so that:

| | | | | |
|---|---|---|---|---|
| $V_{xa}$ | = | $V_{xa,1}$ | typically | +300 V |

-continued

| | | | | |
|---|---|---|---|---|
| $V_{xb}$ | = | $V_{xb,o}$ | typically | 0 V |
| $V_{ya}$ | = | $V_{ya,-2}$ | typically | −200 V |
| $V_{yb}$ | = | $V_{yb,2}$ | typically | +200 V |

In this condition continuous ion beam 33 is deflected by electric field Ey−($\alpha V_{ya}-V_{yb}$) away from the z-axis and towards a third region 36 on collector 13. Region 36 is shown on FIG. 8, which illustrates a typical path 41 as travelled by ion beam 33 across collector 13. During time interval $\Delta t_2$, voltage $V_{xb}$ rises substantially exponentially from $V_{xb,o}$ to $V_{xb,1}$ and voltage $V_{xa}$ falls from $V_{xa}$, 1 to $V_{xr,o}$. So that by the end of interval $\Delta t_2$ the voltages are:

| | | | | |
|---|---|---|---|---|
| $V_{xa}$ | = | $V_{xa,o}$ | typically | 0 V |
| $V_{xb}$ | = | $V_{xb,1}$ | typically | 30 0 V |
| $V_{ya}$ | = | $V_{ya,-2}$ | typically | −200 V |
| $V_{yb}$ | = | $V_{yb,2}$ | typically | +200 V |

In this condition ion beam 33 is deflected towards a fourth region 37 on collector 13, shown on FIG. 8. Next voltage controller 27 switches $V_{ya}$ from $V_{ya,-2}$ to $V_{ya,o}$ and controller 28 switches $V_{yb}$ from $V_{yb,2}$ to $V_{yb,o}$, whereby the voltages are:

| | | | | |
|---|---|---|---|---|
| $V_{xa}$ | = | $V_{xa,o}$ | typically | 0 V |
| $V_{xb}$ | = | $V_{xb,1}$ | typically | +300 V |
| $V_{ya}$ | = | $V_{ya,o}$ | typically | 0 V |
| $V_{yb}$ | = | $V_{yb,o}$ | typically | 0 V |

In this condition ion beam 33 is again incident at first region 34 on collector 13, which is the condition for the start of the cycle (at the beginning of interval $\Delta t_1$).

Hence ions in continuous ion beam 33 are able to pass through aperture 14 during pulse-time 32, and moreover ions are focused from point 38 to point 23 by lens 15; these ions constitute one pulse of the pulsed beam produced by the ion gun. Typical voltages of elements 16, 17 and 18 of lens 15 as shown on FIG. 1 are $V_{L1}=0$ V, $V_{L1}=0.85\ V_s$ and $V_{L3}=0$ V. For the condenser lens 2, typical voltages are $V_{L4}=0$ V, and $V_{L5}=0.85\ V_s$ and $V_{L6}=0$ V. The intermediate image at deflection point 38, and the final image at point 23 are typically 0.1 μm in diameter.

Typically the ion gun may be required to produce a pulsed ion beam with pulses of duration 5 ns and frequency 20 kHz (i.e. period 50 μs); it will be appreciated that to aid clarity time-axis 31 of FIG. 3 is not drawn to scale. The time intervals $\Delta t_a$ and $\Delta t_b$ illustrated on FIG. 4 are typically 5 μs to 10 μs. Voltage controller 25 must be capable of producing waveform $V_{xa}$ with a linear rise-time of approximately 3 ns or less, and correspondingly voltage controller 26 must produce $V_{xb}$ with a linear fall-time of approximately 3 ns or less. Slower rates of rise and fall, for example 10 ns, may be acceptable when providing a pulsed beam with a longer pulse-time, such as 50 ns for example. Suitable voltage controllers are power supplies comprising avalanche transistors or thyratrons.

Clearly, by altering the relative phase of the two waveforms Vxa and Vxb, particularly the relative timings of their fast rising and falling edges, the temporal width of the ion pulse 32 may be readily controlled.

Referring next to FIG. 9 there is shown a sequence of voltage waveforms, similar to FIG. 4, but in which $V_{ya}$ remains at $V_{ya,o}$ (preferably earth) throughout and $V_{yb,o}$ switches between $V_{yb,o}$ and $V_{yb,1}$. If $V_{yb,o}=0$ V, and $V_{yb,1}=+400$ V this has the same effect during time interval $\Delta t_2$ as, in the case of FIG. 4, when $V_{ya,-2}=-200$ V and $V_{yb,2}=+200$ V.

Referring finally to FIG. 10 there is shown an alternative sequence of switching voltage waveforms $V_{xa}$ and $V_{xb}$. In this case, during pulse-time 32, $V_{xa}$ and $V_{xb}$ are equal at values $V_{xa,1}$ and $V_{xb,1}$ respectively. Preferred voltages in this case are: $V_{xa,1}=0$ V, $V_{xb,1}=0$ V, $V_{xa,o}=-300$ V and $V_{xb,o}=-300$ V. FIG. 10 also shows the variation of $\Delta V_y=(V_{yb}-V_{ya})$ in which $V_{ya}$ and $V_{yb}$ vary individually as in FIG. 9, or preferably as in FIG. 4.

What is claimed is:

1. A method of producing a pulsed microfocused ion beam comprising the steps of: generating a substantially continuous ion beam; directing the said beam along a z-axis towards a collector comprising a plate having an aperture therein; said aperture being in registration with said z-axis; maintaining the trajectory of said continuous ion beam substantially stationary and incident at said aperture for a preselected time, to be known as the pulse-time whereby ions will pass through the aperture; directing said continuous ion beam away from said aperture so that said beam impinges on said collector whereby the passage of ions through said aperture is terminated thus producing a pulse of ions; and subsequently redirecting said continuous ion beam so as to cause said beam to again be incident at said aperture.

2. A method as claimed in claim 1 further comprising focusing ions from a deflection point, said deflection point being the point along the z-axis upstream of the apertured plate at which the continuous ion beam is deflected when moved toward and away from said aperture, to a final image point.

3. A method as claimed in claim 2 wherein the ion beam is provided by a source and is focused at said deflection point by means of a condensing lens.

4. A method as claimed in claim 1 wherein the ion beam initially impinges on the collector and wherein the steps of maintaining the trajectory of the ion beam substantially stationary and directing the beam away from the aperture are performed by exercise of control over first and second electrical power sources coupled to respective of a first pair of ion beam deflection electrodes, each power source being capable of changing the state of its output more rapidly in one direction than in the opposite direction, the ion beam being caused to be deflected from a point of initial impingement on the collector to the aperture by changing the state of the output of a first of said power sources in the direction of its rapid change, said ion beam being maintained at the aperture by maintaining substantially constant the outputs of the power sources, and said ion beam being caused to be deflected away from the aperture so as to impinge on the collector by changing the state of the output of the second power source in the direction of its rapid change.

5. A method as claimed in claim 4 wherein the first pair of deflection electrodes cause the beam to move in a direction in a first plane which is generally perpendicular to said z-axis and wherein a further pair of deflection electrodes is provided for deflecting the beam in a different direction, said beam being deflected in said different direction while said first and second power sources change state in said opposite direction, so that the beam does not cross the aperture during the slower change of state of the output of the power sources.

6. A method as claimed in claim 4 wherein the power sources produce two-level voltage pulses and are connected between ground and the respective deflection electrodes such that their outputs are of opposite level when the beam is directed to impinge on the collector and the same level when the beam is directed to the aperture, the first power source rapidly changing its output to the same level as the second power source to direct the ion beam to the aperture and then the second power source rapidly changing its output to the opposite level to direct the beam away from the aperture.

7. A method as claimed in claim 1 comprising deflecting said continuous ion beam by the synchronised actions of a first electric field component Ey, directed parallel to a y-axis, and a second electric field component Ex, directed parallel to an x-axis, wherein said x, y and z axes are mutually orthogonal; and (a) for a time $\Delta t_1$, maintaining Ey at a value $Ey^o$, and during time $\Delta t_1$: starting with said second electric field component Ex at a value $Ex^-$, directed along the negative direction of said x-axis, thereby deflecting said continuous ion beam away from said z-axis and said aperture, towards a first region on a collector; then switching Ex from $Ex^-$ to a value $Ex^o$; whereby said continuous ion beam travels substantially along said z-axis towards and through said aperture; next maintaining Ex at $Ex^o$ for the pulse-time; and then switching Ex from $Ex^o$ to a value $Ex^+$, directed along the positive direction of said x-axis, thereby deflecting said continuous ion beam away from said z-axis and said aperture towards a second region on said collector;

(b) at the end of time $\Delta t_1$ changing Ey from $Ey^o$ to another value, directed along said y-axis, thereby deflecting said continuous ion beam to a third region on said collector;

(c) during a time interval $\Delta t_2$, changing Ex from $Ex^+$ to said value $Ex^-$, and changing Ey from said other value to said value $Ey^o$, thereby returning said continuous ion beam to be incident at said first region on said collector, without allowing said continuous ion beam to be incident at said aperture, and thereby preventing any ions in said continuous ion beam from passing through said aperture, during said time interval $\Delta t_2$.

8. A method as claimed in claim 7 wherein said values $Ex^o$ and $Ey^o$ are substantially equal to zero.

9. A method as claimed in claim 7 wherein the first electric field component Ey is generated by applying a periodically-varying voltage waveform $V_{ya}$ to a first y-deflecting electrode, and periodically-varying voltage waveform $V_{yb}$ to a second y-deflecting electrode; and said second electric field component Ex is generated by applying a periodically-varying voltage waveform $V_{xa}$ to a first x-deflecting electrode and a periodically-varying voltage waveform $V_{xb}$ to a second x-deflecting electrode; said continuous ion beam passing between said first and second y-deflecting electrodes, and between said first and second x-deflecting electrodes in travelling from said source to said aperture and in which in one cycle of operation said method comprises:

(i) for a time $\Delta t_1$:

maintaining $V_{ya}$ at a substantially constant value $V_{ya,o}$ and maintaining $V_{yb}$ at a value $V_{yb,o}$ substantially equal to $V_{ya,o}$;

controlling $V_{xa}$ at a value $V_{xa,o}$, and $V_{xb}$ at a value $V_{xb,1}$, of which $V_{xb,1}$, is numerically greater than $V_{xa,o}$, thereby deflecting said continuous ion beam away from said z-axis and said aperture and towards a first region on said collector;

switching $V_{xb}$ from $V_{xb,1}$ to a value $V_{xb,o}$ which is substantially equal to $V_{xa,o}$ whereby said continuous ion beam travels substantially along said z-axis and through said aperture;

maintaining $V_{xa}$ at $V_{xa,o}$ and $V_{xb}$ at $V_{xb,o}$ for the pulse-time;

Switching $V_{xa}$ from $V_{xa,o}$ to a value $V_{xa,1}$ which is numerically greater than $V_{xb,o}$, thereby deflecting said continuous ion beam away from said z-axis and said aperture, and towards a second region on said collector;

(ii) at the end of time $\Delta t_1$, changing $V_{yb}$ from $V_{yb,o}$ to a value $V_{yb,1}$ thereby deflecting said continuous ion beam towards a third region on said collector;

(iii) during a time interval $\Delta t_2$ changing $V_{xa}$ from $V_{xa,1}$ to $V_{xa,o}$, and changing $V_{xb}$ from $V_{xb,o}$ to $V_{xb,1}$ and changing $V_{yb}$ from $V_{yb,1}$ to $V_{yb,o}$, thereby returning said continuous ion beam to be incident at said first region on said collector, without allowing said continuous ion beam to be incident at said aperture.

10. A method as claimed in claim 9 wherein said step (iii) comprises during said time interval $\Delta t_t$ changing $V_{xa}$ from $V_{xa,1}$ to $V_{xa,o}$, and $V_{xb}$ from $V_{xb,o}$ to $V_{xb,1}$ thereby deflecting said continuous ion beam towards a fourth region on said collector, and subsequently changing $V_{yb}$ from $V_{yb,1}$ to $V_{yb,o}$ at the end of time interval $\Delta t_2$.

11. A method as claimed in claim 9 wherein $V_{xa,o}$ and $V_{xb,o}$ are substantially equal to zero potential.

12. A method of analyzing a sample by time-of-flight secondary particle mass spectrometry comprising: producing a pulsed microfocused ion beam by generating a substantially continuous ion beam traveling from a source along a z-axis toward a collector comprising a plate having an aperture therein, said aperture lying on said z-axis; maintaining said continuous ion beam to be substantially stationary and incident at said aperture for a time, to be known as the pulse-time; directing said continuous ion beam away from said aperture so as to impinge on the collector; and subsequently returning said continuous ion beam to be incident at said aperture; focusing said primary ion beam on to said sample, thereby causing secondary particles to be released from said sample; and measuring the times-of-flight of said secondary particles over a flight path from said sample to a detector.

13. A pulsed microfocused ion gun comprising:

a source of a substantially continuous ion beam and a collector comprising a plate having an aperture, there being defined a z-axis passing from said source through said aperture;

first deflecting means comprising a first x-deflecting electrode and a second x-deflecting electrode disposed on an x-electrode axis which is orthogonal to said z-axis, and separated by a first gap, through which said z-axis passes;

means to generate, and to apply to said first x-deflecting electrode, a first voltage waveform $V_{xa}$ comprising a sequence of pulses, in each of which $V_{xa}$ rises in a substantially linear fashion from a voltage $V_{xa,o}$ to a voltage $V_{xa,1}$, remains substantially equal to $V_{xa,1}$ for a time interval $\Delta t_a$, and then falls in a substantially exponential fashion to $V_{xa,o}$;

means to generate and to apply to said second x-deflecting electrode a second voltage waveform $V_{xb}$ comprising a sequence of pulses, in each of which $V_{xb}$ falls in a substantially linear fashion from a voltage $V_{xb,1}$ to a voltage $V_{xb,o}$ which is substantially equal to $V_{xa,o}$, remains substantially equal to $V_{xb,o}$ for a time interval $\Delta t_b$ and then rises in a substantially exponential fashion from $V_{xb,o}$ to $V_{xb,1}$;

means to synchronise said first voltage waveform $V_{xa}$ with said second voltage waveform $V_{xb}$, whereby at a time, known as the pulse-time, after $V_{xb}$ falls from $V_{xa,o}$ to $V_{xb,o}$, it is arranged that $V_{xa}$ rises from $V_{xa,o}$ to $V_{xa,1}$, and during said pulse-time ions travel substantially undeflected, substantially along said z-axis to and through said aperture;

second deflecting means to deflect said continuous ion beam away from said z-axis in a direction orthogonal to said z-axis and at an angle to said x-electrode axis; and means to apply a voltage to said second deflecting means to deflect said continuous ion beam away from said aperture while $V_{xa}$ is falling from $V_{xa,1}$ to $V_{xa,o}$ and while $V_{xb}$ is rising from $V_{xb,o}$ to $V_{xb,1}$.

14. A time-of-flight secondary particle mass spectrometer for the analysis of a sample and comprising an ion gun for producing a pulsed microfocused primary ion beam at a final primary ion image point on a surface of said sample, said ion gun comprising means for generating a substantially continuous ion beam travelling from a source toward a collector plate having an aperture therein, means for maintaining said ion beam to be substantially stationary and incident at said aperture for a pulse time, means for directing said continuous ion beam away from said aperture onto said collector plate, and means for subsequently returning said continuous ion beam to be incident at said aperture; and a particle detector for detecting secondary particles released from said surface by the action of said pulsed, microfocused primary ion beam.

15. A spectrometer as claimed in claim 14 further comprising a focusing lens for focusing ions passing through said aperture to an image and a condensing lens, disposed between the source of the ions and said collector plate, for focusing the continuous ion beam to a deflection point located upstream of said plate in the direction of ion travel.

16. A spectrometer as claimed in claim 14 further comprising an energy-focusing particle analyzer, disposed between the sample and the detector, for focusing secondary particles of equal mass but differing energies from the primary ion image point on said surface to a common secondary particle image point at the detector.

* * * * *